(12) United States Patent  
Honma

(10) Patent No.: US 6,721,038 B2
(45) Date of Patent: Apr. 13, 2004

(54) DEVICE FOR STEP-AND-REPEAT EXPOSURE OF A SUBSTRATE

(75) Inventor: Jun Honma, Machida (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 1 day.

(21) Appl. No.: 09/983,612

(22) Filed: Oct. 25, 2001

(65) Prior Publication Data

US 2003/0081190 A1 May 1, 2003

(51) Int. Cl.$^7$ .......................... G03B 27/54; G03B 27/42
(52) U.S. Cl. ............................ 355/67; 355/53
(58) Field of Search ................... 355/53, 67

(56) References Cited

U.S. PATENT DOCUMENTS

| | | | |
|---|---|---|---|
| 4,577,959 A | * 3/1986 | Yazaki | 355/53 |
| 5,636,005 A | * 6/1997 | Yasuzato | 250/548 |
| 5,881,165 A | 3/1999 | Tanaka | 382/151 |

FOREIGN PATENT DOCUMENTS

| | | |
|---|---|---|
| JP | 8-062850 | 3/1996 |
| JP | 11-260705 | 9/1999 |
| JP | 2000-98619 | 4/2000 |

* cited by examiner

Primary Examiner—Rodney Fuller
(74) Attorney, Agent, or Firm—Nixon Peabody LLP; David S. Safran

(57) ABSTRACT

A exposure device including a lamp and integrator lens for exposure of a substrate having a plurality of rectangular exposure zones and including a substrate carrier capable of supporting a substrate. The substrate moves in the X-Y directions and the respective exposure zones on the substrate are progressively exposed. The exposure device also includes a holding part for the integrator lens, which is composed of a parallel arrangement of several lenses yielding a rectangular cross sectional shape, that enables the integrator lens to turn 90° around the optical axis of the incident light. This arrangement permits precise illumination of the exposure zones on the substrate as the exposure zones on the substrate change orientation.

1 Claim, 4 Drawing Sheets

DEVICE FOR STEP-AND-REPEAT EXPOSURE OF A SUBSTRATE

BACKGROUND OF THE INVENTION

1. Field of the Invention

The invention relates to an exposure device which is used for production of a substrate such as a printed board, a liquid crystal substrate, or the like. The invention relates particularly to an exposure device which divides a substrate into several rectangular exposure zones and gradually exposes the respective exposure zones.

2. Description of Related Art

In an apparatus for the production of a semiconductor device, a unique process is carried out where a mask pattern, which has been formed on a mask, is exposed onto a wafer substrate to be treated. In this process the following is done:

The area to be exposed on a wafer is divided into several areas;

The mask pattern is projected onto the above described areas which have been formed by the division;

A substrate carrier, on which the wafer has been placed, is moved by a given amount; and The above described exposure areas which have been formed by division are moved in rows to an exposure position and progressively exposed.

This process is generally called step-and-repeat exposure.

Conventionally, except for the above described apparatus for production of a semiconductor device, the exposure of a workpiece in fields, for example in the field of producing a printed board, a liquid crystal substrate or the like, overall exposure has been performed in which a mask is prepared which is essentially the same size as the substrate and in which the entire exposure area of the substrate is exposed at once. Recently, however, in the above described fields the step-and-repeat exposure process is being used more often to prevent enlargement of the mask corresponding to the enlargement of the substrate.

When the mask becomes large, the disadvantages are that the production costs for the mask become greater, and that, as a result of the mask's own weight, the exposure precision decreases, as well as similar disadvantages. In a step-and-repeat exposure process the size of the mask can be made smaller than the size of the substrate and thus the above described defects can be eliminated.

The above described exposure device for the step-and-repeat exposure process for a printed board, a liquid crystal substrate or the like is disclosed, for example, in Japanese patent disclosure document JP 8-62850 (patent 2904709: proximity exposure system) and in Japanese patent disclosure document JP 9-82615 (patent 2994991: projection exposure type, U.S. Pat. No. 5,881,165).

When a printed board, liquid crystal substrate or the like is exposed, there are many cases in which the area onto which the mask pattern is transmitted and exposed is rectangular (the lengthwise and the transverse sides being of different length). This circumstance is also dependent on what kinds of parts are being produced. When the above described exposure area has a rectangular shape, the area in which the mask pattern is produced also has a rectangular shape.

It is described in Japanese patent disclosure document JP 11-260705 and Japanese patent disclosure document JP 2000-98619 that the individual lenses which comprise the compound lens have a rectangular shape. These compound lenses (hereinafter called the integrator lens) are located in the light source part of an exposure device in order to irradiate the rectangular exposure area with high efficiency. In compound lenses several lenses are located parallel to one another in the lengthwise and transverse direction.

The above described integrator lens is an optical element which is used generally for an exposure device or the like. It is positioned to make uniform the distribution of the illuminance of the light emitted onto the surface to be exposed. The integrator lens is formed by several lenses being located parallel to one another in the lengthwise and transverse direction. The integrator lens is located at a position at which the light emitted from a lamp is focused by means of a condenser mirror or located in the vicinity of this position.

In the aforementioned documents (Japanese patent disclosure documents JP 11-260705 and 2000-98619), it is described that the individual lenses comprising the integrator lens have a rectangular shape when the shape is viewed from the direction of the optical axis in order to irradiate the rectangular irradiation area without reducing the light utilization factor.

When light from a lamp is incident on an integrator lens in which there are several hexagonal column-shaped or cylindrical lenses next to one another, the light emerging from this integrator lens has an essentially circular cross section. When this circular irradiation shape is emitted unaltered onto a mask and is cut off at a right angle by the mask pattern, the amount of unused light is increased, by which the utilization factor of the light becomes low.

If, on the other hand, an integrator lens is used in which there are several columns with a rectangular cross section next to one another, and when the cross sectional shape of the light emerging from this integrator lens according to the mask pattern is changed into a rectangular shape, the light that is wasted is reduced resulting in the light utilization factor becoming higher. This increases both the illuminance and also the throughput. When light is incident on an integrator lens with such an arrangement, the shape which the emerging light forms on the irradiation surface becomes a shape similar to the shape of the above described individual lenses, when viewed from the direction of the optical axis, even if the cross section of the incident light is circular.

FIG. 3 shows one example of an exposure device which emits rectangular light using the above described integrator lens and progressively exposes the exposure areas on a printed board. In FIG. 3, reference number 1 labels a lamp and reference number 2 labels a condenser mirror which focuses the light from the lamp 1. This focused light is incident via a reflector 3 on an integrator lens 4. The shape of the integrator lens 4 is identical to the shape described in the aforementioned documents. The integrator lens 4 is formed by several lenses being located parallel to one another in the lengthwise and transverse direction, and has a cross section, in the direction perpendicular to the optical axis, which has a rectangular shape. The light emerging from the integrator lens 4 is shaped into a rectangle, as is described in the aforementioned documents, is then reflected by a reflector 5 to be incident on a collimator 6 to be converted into parallel light and emitted onto a mask 7. A mask pattern on the mask 7 is recorded on a rectangular area to form a mask pattern. This mask pattern is projected via a projection lens 8 onto the surface of a substrate 10 to be exposed, such as a printed board or the like, which has been placed on a workpiece carrier 9. By moving the workpiece carrier 9 in the X-Y directions the substrate is progressively moved, and in the exposure area of the substrate the mask pattern is progressively exposed.

A projection exposure device is described above. But the same also applies in a proximity exposure device in which, without using a projection lens, a mask and a substrate are caused to approach one another and a mask pattern is exposed onto the substrate.

The light utilization factor is improved since the rectangular shaped light is emitted onto the mask by means of the integrator lens. However, with respect to changes in the shape of the area to be exposed on the substrate, multipurpose applicability is lost. This aspect is described below.

It is desirable for different mask patterns to be exposed in one exposure device. The size and shape of the area on the substrate onto which a pattern is exposed is changed by the different types of products to be exposed and different processes employed.

It was described above that when a printed board, a liquid crystal substrate or the like is exposed, the area onto which the mask pattern is transmitted and exposed (hereinafter called the exposure zone) generally has a rectangular shape (the lengthwise and transverse sides being of different length). But cases arise in which production is possible with higher efficiency when the exposure zones on a substrate are more wide than long and are next to one another, as is shown in FIG. 4(a), or in which production is possible with higher efficiency when the exposure zones are located next to one another on a substrate and are more long than wide, as is shown in FIG. 4(b). Therefore, cases occur in which the exposure zones, due to different products being produced or different processes, are arranged in the manner shown in FIG. 4(a) or in the manner shown in FIG. 4(b), even if a substrate with the same shape is used for each exposure. This means that the arrangement of the respective exposure zones on the substrate is chosen such that the respective exposure zones are located most effectively on the substrate according to the differences of the products to be produced and the processes employed.

Assuming that in an exposure device an integrator lens is installed for a pattern which is more wide than long, and that the exposure zones shown in FIG. 4(a) are exposed by means of light which is more wide than long, an entire mask pattern which is more long than wide cannot be irradiated; even when using a device for exposure with light which is more long than wide and which is shown in FIG. 4(b). In one such case, either the integrator lens is replaced by an integrator lens which can irradiate with light which is more long than wide, or the substrate is turned by 90° and placed on the workpiece carrier. Here the disadvantages are the following:

(1) It is necessary to make available two integrator lenses if the integrator lens is to be replaced. Since each integrator lens is formed by a combination of several quartz lenses which have been processed with high precision, the production costs rise. Furthermore, that integrator lens which is not being used must be stored such that neither cloudiness or scratches are formed on the lens surface. This increases the storage costs.

(2) After replacing the integrator lens, it is necessary to carry out calibration and confirmation so that the optical axis of the light incident on the integrator lens agrees with the optical axis of the integrator lens. When the two optical axes do not agree with one another in optical efficiency, the disadvantage arises that the distribution of the illuminance becomes non-uniform or the like. This calibration and confirmation requires a lot of time.

(3) In the case in which the printed board is being transported by a carrier robot or the like, a concept is needed for how the substrate can be turned by 90° when it is placed on the workpiece carrier. In this arrangement, the carrier device becomes complex and production costs for the entire exposure device also increase.

SUMMARY OF THE INVENTION

The invention set forth below was devised to eliminate the aforementioned disadvantages of the prior art. The object of the invention is to construct a device for step-and-repeat exposure of a rectangular substrate in which the irradiation area is shaped to be rectangular by an integrator lens which progressively exposes the respective exposure zones on the rectangular substrate, in which the irradiation area on the substrate can be switched according to the exposure zones on the substrate without replacing the integrator lens and without changing the direction of the substrate which is placed on the workpiece carrier.

This object of the invention is achieved as follows:

In an exposure device which progressively exposes the respective exposure zones with a rectangular shape (the lengthwise and transverse sides being of different length) on a substrate, there is provided an integrator lens in which several lenses, in the lengthwise and transverse direction, are located parallel to one another, with a cross section in the direction perpendicular to the optical axis which has a rectangular shape (the lengthwise and transverse sides being of different length), such that the integrator lens optical axis agrees with the optical axis of the incident light, and this integrator lens is rotatably held at either a first position or a second position, the second position being achieved by turning the integrator lens 90° around the optical axis of the incident light from the first position on the integrator lens. Furthermore, the position of the integrator lens is switched according to the arrangement of the exposure zones on the substrate into the first position or the second position and thus the irradiation area on the substrate is switched.

This means that the integrator lens, which is changing the light incident on the mask into rectangular light, is turned by 90° and exposed when the shape of the exposure zones is changed from "more long than wide" to "more wide than long" or from "more wide than long" to "more long than wide", as shown in FIGS. 4(a) and 4(b).

In this way, the irradiation area on the substrate can be switched by simple activation without replacing the integrator lens or without changing the direction of the substrate which is placed on the workpiece carrier. Thus, exposure can be done according to the arrangement of the exposure zones on the substrate.

Furthermore, adjustment of the optical axis after switching is not necessary due to the fact that the integrator lens is turned by 90° around the optical axis. Thus, the device can be greatly simplified and costs reduced.

DETAILED DESCRIPTION OF THE INVENTION

Figure 1:
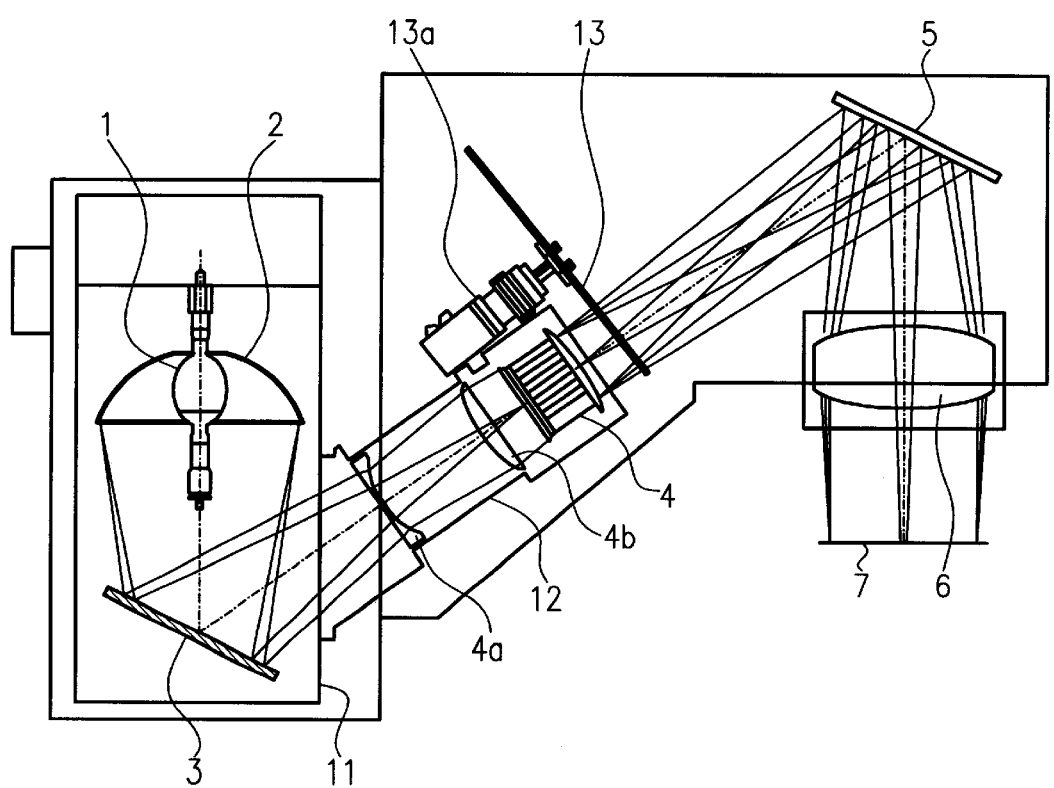
FIG. 1 shows a schematic of the arrangement of a lamp housing of one embodiment of an exposure device according to the invention.

FIG. 1 is a schematic cross section of a lamp housing of one embodiment of an exposure device of the invention. In FIG. 1, reference number 11 labels the housing in which the lamp 1, the condenser mirror 2 and the reflector 3 are located. Furthermore, reference number 12 labels a holding part for an integrator lens in which the integrator lens 4, a first lens 4a and a second lens 4b are installed, and which has a device which enables the integrator lens 4 to turn around the optical axis by 90°, as is described below. Furthermore, reference number 13 labels a closure, while reference number 13a labels a closure drive device, and reference number 5 labels a reflector and reference number 6 labels a collimator. In FIG. 1, the light from the lamp 1 is focused by means of the condenser mirror 2 and is incident on the integrator lens 4 via the reflector 3 and furthermore via the first lens 4a and the second lens 4b which are located in the holding part 12 for the integrator lens. The integrator lens 4 is defined, as was described above, as compound lenses in which several lenses, each with a cross section of a rectangular shape in the direction perpendicular to the optical axis, are arranged parallel to one another in the lengthwise and transverse direction.

The light which emerges from the integrator lens 4 and which has been made rectangular is reflected by the reflector 5, is incident in the collimator 6, and is converted into parallel light.

Figure 3:
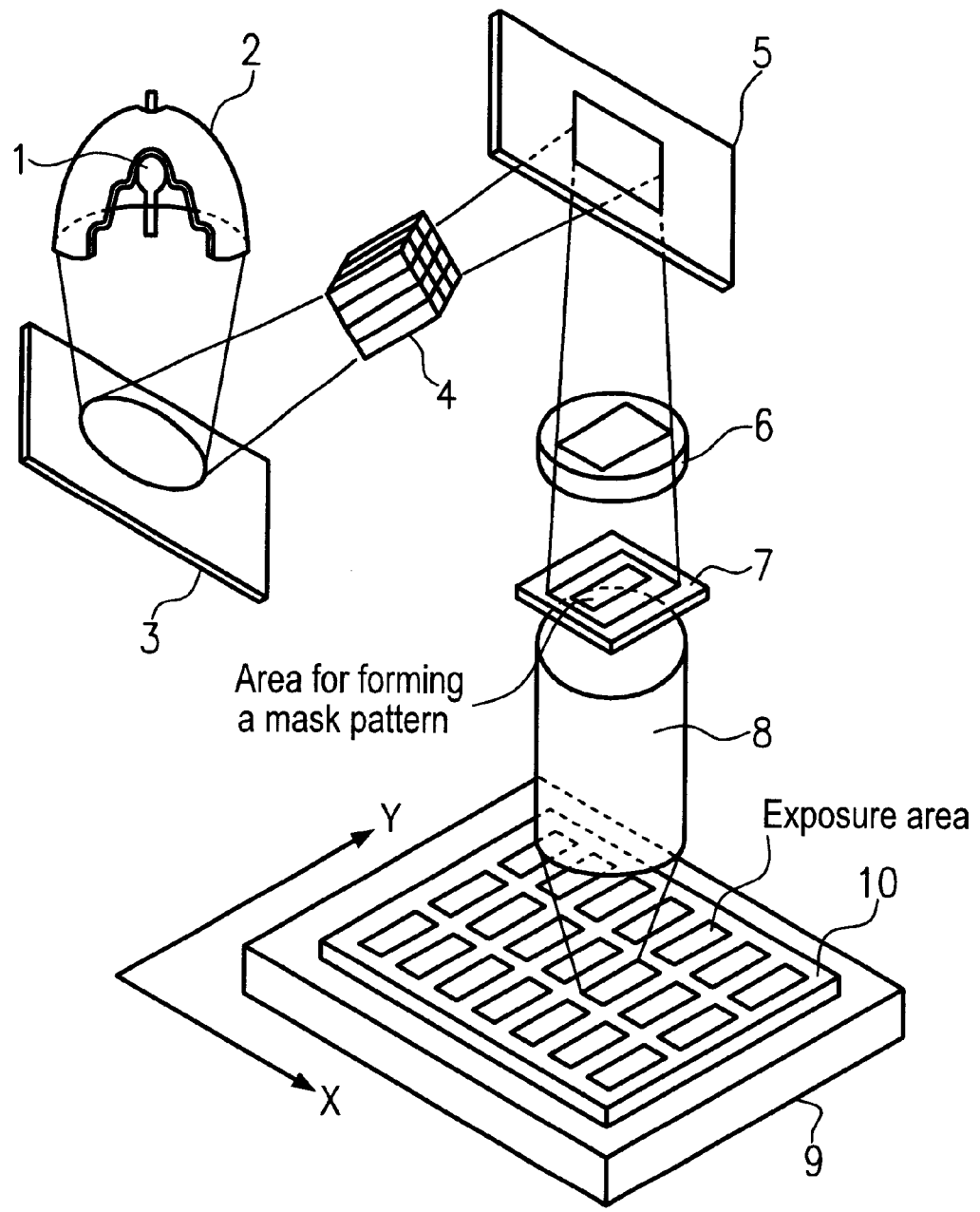
FIG. 3 shows a schematic of one example of an exposure device which irradiates with rectangular light and progressively exposes the exposure areas on a printed board.

As was shown in FIG. 3, the light emerging from the collimator 6 is emitted onto the mask 7. In the case of a projection exposure device, via the projection lens 8 the mask pattern on the mask 7 is projected onto the surface of the substrate 10 to be irradiated. In the case of a proximity exposure device the mask pattern on the mask 7 is projected onto the surface of a substrate to be exposed which is located adjacent to the mask. The substrate 10 is moved in the X-Y directions and the mask pattern is progressively projected onto the respective exposure areas of the substrate 10.

Figures 2A, 2C:
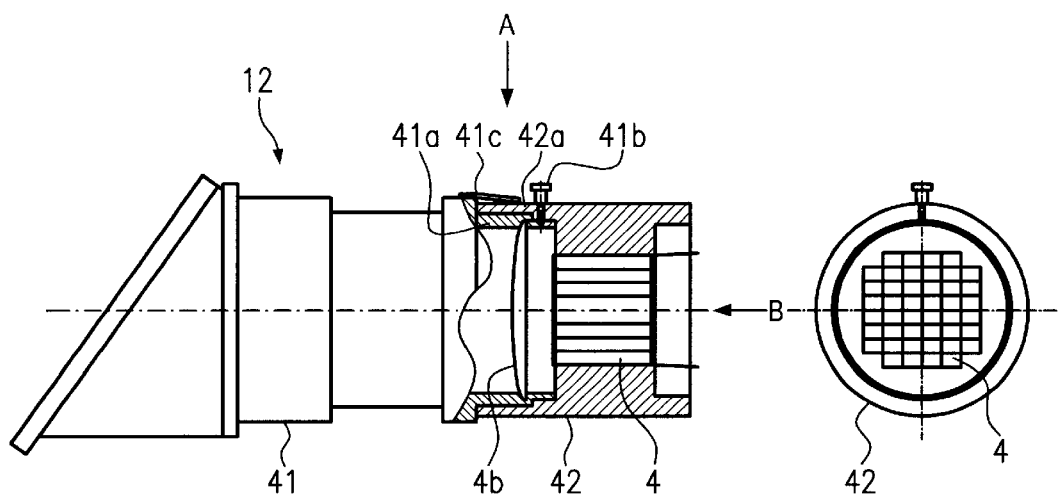
FIGS. 2(a)–2(c) each show a schematic of the arrangement of a holding part for an integrator lens according to the invention.
Figure 2B:
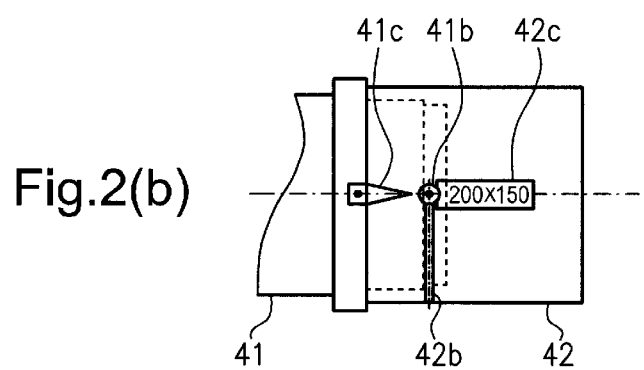

FIGS. 2(a) to (c) each show the arrangement of the above described holding part 12 for an integrator lens. FIG. 2(a) shows a cross section of a portion of the holding part 12 shown in FIG. 1 for an integrator lens and shows the integrator lens element in a cross section. FIG. 2(b) is a representation in which FIG. 2(a) was viewed from direction A. FIG. 2(c) is a representation in which FIG. 2(a) was viewed from direction B. In FIG. 2(a), the left side is the side on which the light is incident, while the right side is the light exit side.

As is shown in FIG. 2(a), the holding part 12 for the integrator lens consists of a first holder 41 and a second holder 42 each of which are mounted in the above described housing 11. The second holder 42 is installed to rotate relative to the first holder 41. The integrator lens 4 is mounted in the second holder 42. The integrator lens 4, as is shown in FIG. 2(c), is formed by several lenses being arranged parallel to one another, with a cross section which has a rectangular shape in the direction perpendicular to the optical axis. The integrator lens 4 is arranged such that its axis coincides with the optical axis which passes through the middle of the second holder 42.

On the other end of the first holder 41 there is a staggered area 41a into which the front area 42a of the second holder 42 fits such that it covers the staggered area 41a. Both the staggered area 41a of the first holder and the front area 42a of the second holder 42 are made cylindrical and the second holder 42 is installed to rotate with respect to the first holder 41. In the front area 42a of the second holder 42, as is shown in FIG. 2(b), along its direction of rotation, a through groove 42b is formed over a peripheral segment of 90°. On the other hand, in the first holder 41 a knurled screw 41b is installed which penetrates the through groove 42b and fits by threaded engagement into the first holder 41. Therefore, by rotating and securing the knurled screw 41b the second holder 42 is attached such that it can no longer turn with respect to the first holder.

As is shown in FIG. 2(b), in the first holder 41 there is a pointer 41c. Furthermore, on one end of the through groove 42b of the second holder 42 there is a display plate 42c installed in which the size, in the lengthwise and transverse direction, of the exposure area is displayed. Furthermore, on the other end of the through groove 42b there is another such display plate (not shown in the drawings). FIG. 2(b) shows the state in which the knurled screw 41b is attached to one end of the through groove 42b. To switch the exposure area, the knurled screw 41b is loosened and the second holder is turned along the through groove 42b by 90°. When the knurled screw 41b reaches the other end of the through groove 42b and the position of the display plate, not shown in the drawings, aligns with the position of the pointer 41c, the knurled screw 41b is again secured such that the second holder 42 does not turn. If an adjustment is made such that the center axis of the second holder 42 aligns with the optical axis, the second holder 42 turns around the optical axis and also the integrator lens 4 turns around the optical axis by 90°. Therefore, the integrator lens 4 can be rotated 90° from a first position to a second position and can be secured.

Figure 4A:
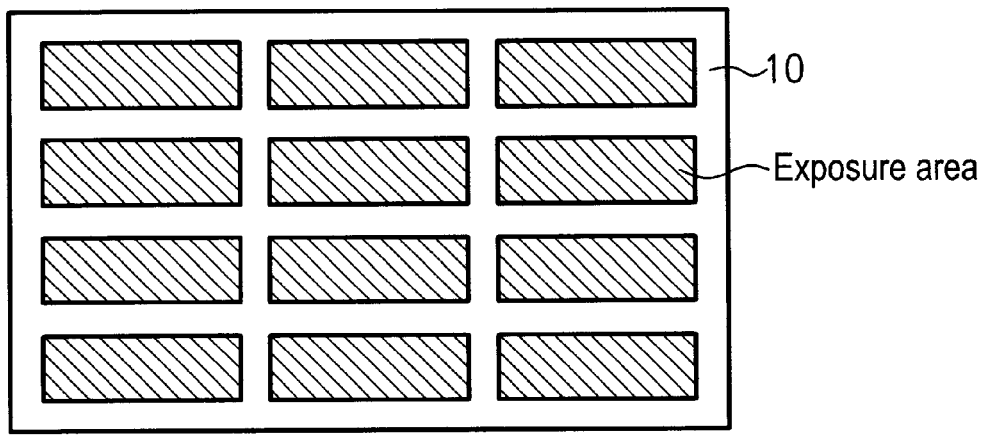
FIGS. 4(a) and (b) each show a schematic of one example of the arrangement of exposure zones on a substrate.
Figure 4B:
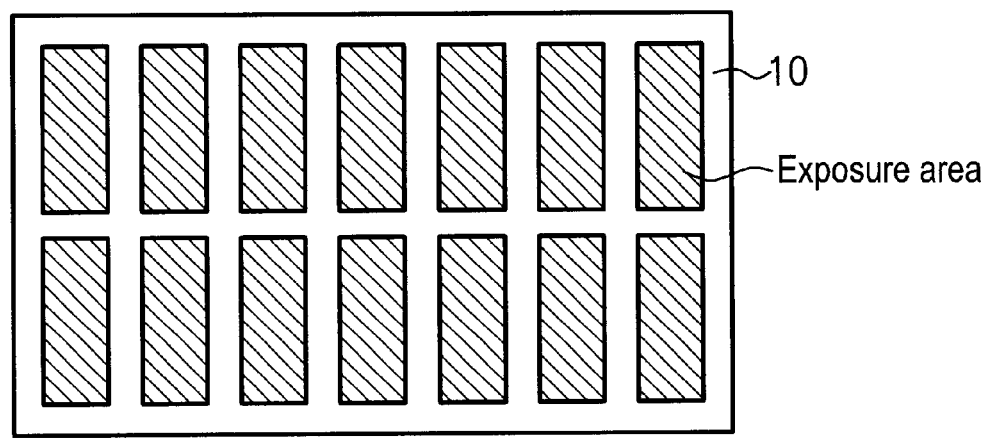

For example, in the situation in which the integrator lens is used for the "more wide than long" case, after turning by 90° the integrator lens is used for the case "more long than wide", as is shown in FIG. 2(c). When the shape of the area of the pattern to be exposed onto the printed board changes, for example from FIG. 4(a) to FIG. 4(b), the exposure area can be switched by turning the second holder 42.

As was described above, the device of the invention realizes the following effects can be obtained:

(1) Since the integrator lens can be moved to the first and second positions which are formed by rotation by 90° around the optical axis and thus exposure can be done, it is possible to react to a mask pattern which is more long than it is wide, or on a mask pattern which is more wide than it is long, in a suitable manner.

(2) Since the integrator lens is secured to be able to turn around the optical axis, no adjustment and attachment processes are necessary to move the optical axis of the integrator lens into agreement with the optical axis of the incident light when the integrator lens is being turned.

(3) Due to the positioning of a turning device for rotating the integrator lens, costs are less than in the case of making available two integrator lenses even if the number of required parts becomes somewhat larger. Furthermore, the arrangement of a turning device of the invention is far simpler and much less costly than in the situation of adding and changing a carrier device for transport of the substrate. The exposure apparatus can also be prevented from becoming too large.

What is claimed is:

1. A device for the step-and-repeat exposure of a substrate comprising
a work piece carrier for receiving a substrate bearing several rectangular exposure zones having unequal length and width dimensions wherein the exposure zones on the substrate are progressively moved in rows to an exposure position by the work piece carrier, an exposure means in which light emerging along an optical axis from a light source is emitted via a compound lens onto a mask having a rectangular shape mask pattern thereon having unequal length and width dimensions, said compound lens being formed by a parallel arrangement in the lengthwise and transverse direction of a plurality lenses, such that a cross section of each lens of the compound lens has a rectangular shape in the direction perpendicular to the optical axis having unequal length and width dimensions, and in which the mask pattern is progressively exposed onto a respective rectangular exposure zone on the substrate, wherein the compound lens is supported within a holding part to be rotated between a first position and a second position, the second position being 90° offset from the first position around the optical axis of the light which is incident on the compound lens such that the position of the compound lens can be switched from either the first position or the second position depending on which of the length and width is longer in the arrangement of the rectangular exposure zones on the substrate.

* * * * *